United States Patent
Osann, Jr.

[19]

[11] Patent Number: 5,872,448
[45] Date of Patent: Feb. 16, 1999

[54] INTEGRATED CIRCUIT ARCHITECTURE HAVING AN ARRAY OF TEST CELLS PROVIDING FULL CONTROLABILITY FOR AUTOMATIC CIRCUIT VERIFICATION

[75] Inventor: Robert Osann, Jr., San Jose, Calif.

[73] Assignee: Lightspeed Semiconductor Corporation, Sunnyvale, Calif.

[21] Appl. No.: 707,912

[22] Filed: Sep. 10, 1996

Related U.S. Application Data

[63] Continuation of Ser. No. 575,056, Dec. 21, 1995, abandoned, which is a continuation of Ser. No. 436,495, May 8, 1995, abandoned, which is a continuation of Ser. No. 924,506, Aug. 4, 1992, abandoned, which is a continuation-in-part of Ser. No. 717,337, Jun. 18, 1991, abandoned.

[51] Int. Cl.$^6$ .................................................. G01R 31/28
[52] U.S. Cl. ..................... 324/158.1; 324/73.1; 371/22.1
[58] Field of Search ............................... 324/73.1, 158.1, 324/765, 760; 371/22.1, 22.3, 22.2, 22.6, 15.1; 437/8; 438/14, 17, 18; 257/60, 48

[56] References Cited

U.S. PATENT DOCUMENTS

| | | | |
|---|---|---|---|
| 4,441,075 | 4/1984 | McMahon | 371/22.3 |
| 4,488,259 | 12/1984 | Macy | 371/22.3 |
| 4,556,840 | 12/1985 | Russell | 324/73 |
| 4,682,329 | 7/1987 | Kluth et al. | 371/22.3 |
| 4,701,921 | 10/1987 | Powell et al. | 371/25 |
| 4,739,250 | 4/1988 | Tanizawa | 371/22.2 |
| 4,749,947 | 6/1988 | Gheewala | 371/22.6 |
| 4,752,729 | 6/1988 | Jackson | 371/22.1 |
| 4,780,874 | 10/1988 | Lenoski et al. | 371/22.3 |
| 4,926,425 | 5/1990 | Hedtke et al. | 371/22.6 |
| 4,931,722 | 6/1990 | Stoica | 324/158 R |
| 5,043,986 | 8/1991 | Agrawal et al. | 371/25.1 |
| 5,054,024 | 10/1991 | Whetsel | 371/22.3 |
| 5,068,605 | 11/1991 | Yasunaga et al. | 324/158 R |
| 5,384,533 | 1/1995 | Tokuda et al. | 324/158.1 |
| 5,528,600 | 6/1996 | El Ayat et al. | 371/22.1 |
| 5,534,774 | 7/1996 | Moore et al. | 324/158.1 |
| 5,614,818 | 3/1997 | El Ayat et al. | 324/158 |

*Primary Examiner*—Vinh P. Nguyen
*Attorney, Agent, or Firm*—Fliesler, Dubb, Meyer & Lovejoy LLP

[57] ABSTRACT

A new circuit architecture is provided for testing digital integrated circuits which allows one to arbitrarily force any combination of logic values to be simultaneously driven onto any combination of internal nets. This allows all of the connections to each internal logic cell, and the logic cell itself, to be verified by applying a set of test patterns to each logic cell individually. In this way, the integrity of the entire device can be verified without having knowledge of the operation of the circuit as a whole.

47 Claims, 3 Drawing Sheets

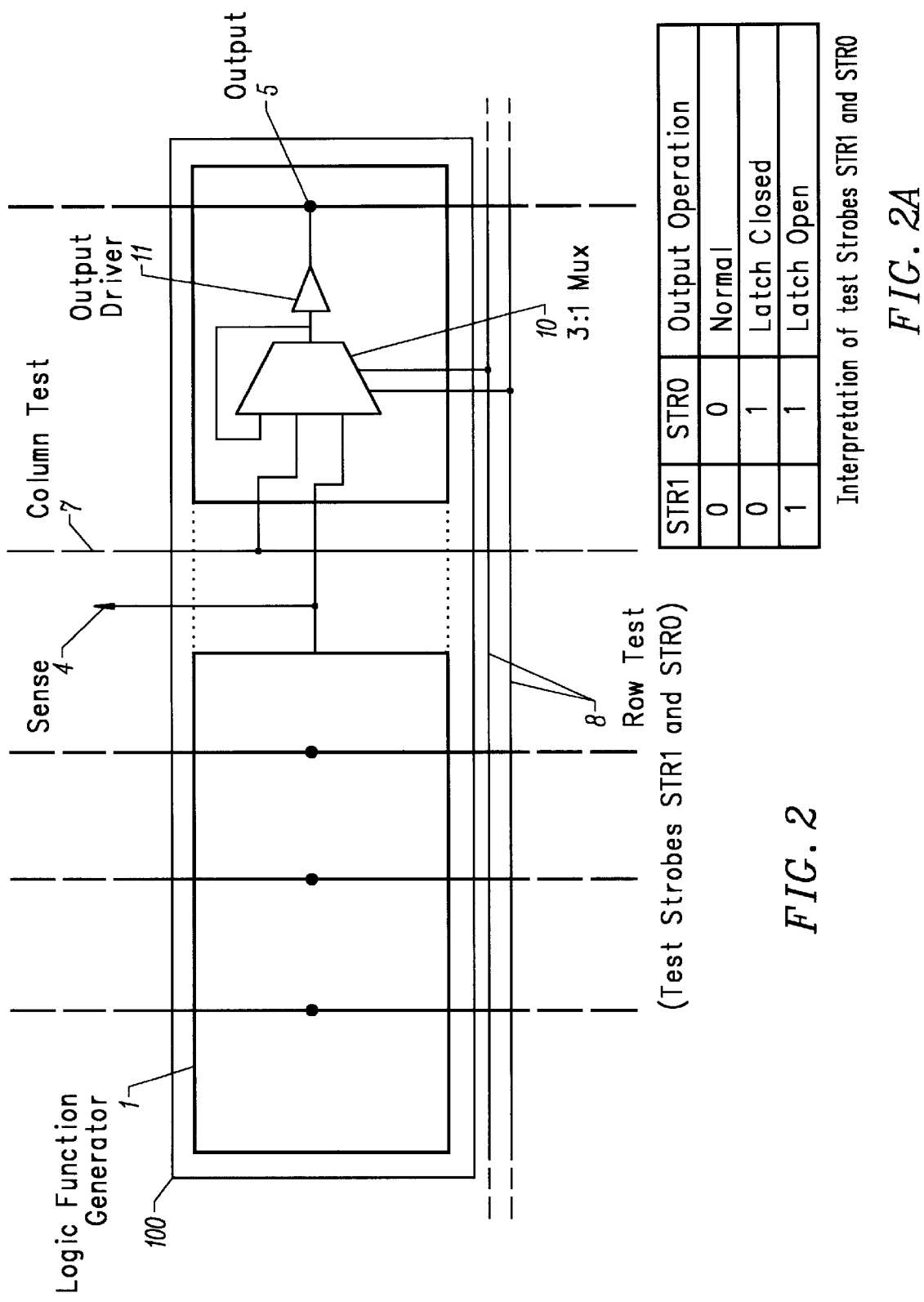

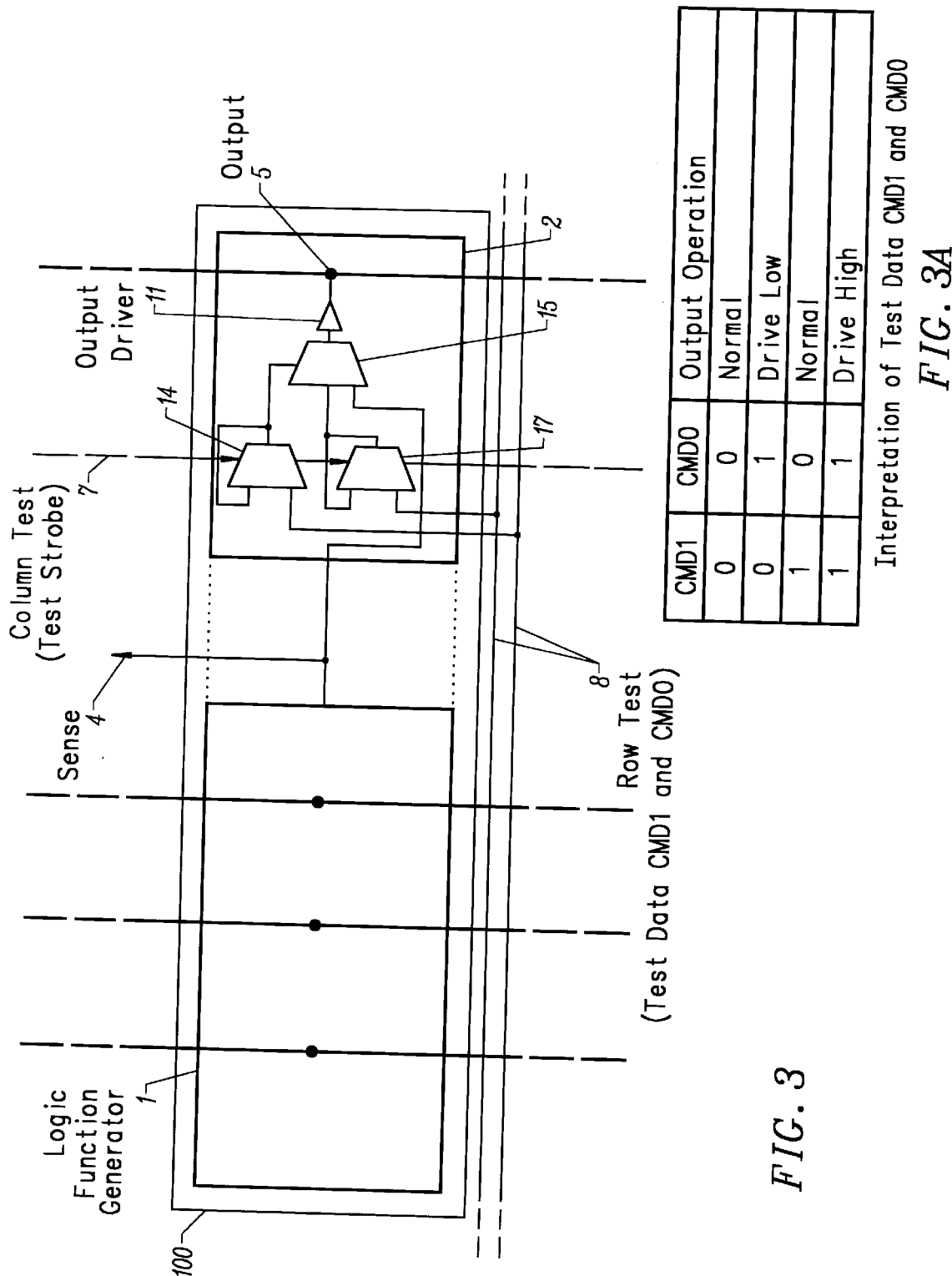

INTEGRATED CIRCUIT ARCHITECTURE HAVING AN ARRAY OF TEST CELLS PROVIDING FULL CONTROLABILITY FOR AUTOMATIC CIRCUIT VERIFICATION

CROSS-REFERENCE TO RELATED DOCUMENTS

This application is a Continuation of Ser. No. 08/575,056, filed on Dec. 21, 1995, now abandoned, which is a Continuation of Ser. No. 08/436,495, filed May 8, 1995, now abandoned, which is a Continuation of Ser. No. 07/924,506, filed Aug. 4, 1992, now abandoned, which is a Continuation-In-Part of Ser. No. 07/717,337, filed on Jun. 18, 1991, now abandoned. The present application and all preceding parent applications relate to disclosure document Ser. No. 229,472 which has the same title and inventor as the present application and was filed Jun. 19, 1989 under the Disclosure Document Program.

FIELD OF THE INVENTION

This invention relates to imbedded test structures for integrated circuits, and in particular to structures for testing those devices known as Application Specific Integrated Circuits or ASICs.

BACKGROUND OF THE INVENTION

This invention addresses the problem of testing complex digital integrated circuits. Many families of integrated circuits fall into the category known as ASICs. The most prolific of these is known as Gate Arrays. Gate Arrays are usually prefabricated up to a certain stage (typically through all steps except metalization). The metal patterns are then configured according to the needs of the user's application. For these types of ASICs, it is necessary to test the circuit after the fabrication process is completed to insure the integrity of the circuit.

Today, virtually all such testing is done by applying a stream of test vectors to the integrated circuit device. A test vector is a pattern of signal values, some of which are applied to the integrated circuit device, and some of which represent an expected response from the integrated circuit device. The important point is that these vectors are applied to the periphery of the integrated circuit device, in a sequence which corresponds to a proper operational sequence of the integrated circuit device's internal circuitry. Most important is that this stream of vectors must be created and that the burden of this tedious task almost always falls on the user himself.

There have been many attempts to provide software which creates these vectors automatically. Unfortunately, none of these attempts have produced a solution which works for the majority of user applications. Automated solutions which functionally exercise a circuit work best when the user's application is implemented in regular, synchronous circuits. To further automate the testing of such synchronous designs, engineers have often added test circuitry to integrated circuits which is known as "scan test" circuitry, also known as "LSSD" and "boundary scan" circuitry. Examples of this type of test circuit are many, and include U.S. Pat. No. 4,488,259 to Mercy, U.S. Pat. No. 4,441,075 to McMahon, U.S. Pat. No. 4,780,874 to Lenoski, and U.S. Pat. No. 4,682,329 to Kluth, among others.

Scan test structures rely on stages of registers placed between blocks of combinatorial logic where extra circuitry has been added to allow the register contents to be shifted either in or out to allow the initialization or observation of logic states during testing. Unfortunately, a great many engineers don't design fully synchronous circuits where this type of structure can be used.

Attempts have also been made to add various forms of imbedded test circuitry aimed at testing integrated circuits regardless of what design style was employed by the designer. One of these is shown in U.S. Pat. No. 4,739,250 to Tanizawa where a gate array comprised of logic cells has a separate access circuit attached to an input of each logic cell, this access circuit being able to force a specific logic value at the output of the logic cell under control of row and column selection wires. This scheme can test every logic cell and connection, but only if they are of the simple NAND or NOR variety. It cannot arbitrarily apply any pattern to the inputs of all logic cells due to the limitation of the row and column addressing which controls the access circuits which, in turn, drive the test input of each logic cell. While it is possible to construct a gate array which uses simple NAND or NOR gates as the logic cell, a more complex logic cell is generally more effective when test circuitry is to be added on a per-cell basis.

Another test circuit which is intended for integrated circuits which may use either synchronous or non-synchronous designs is shown in U.S. Pat. No. 4,749,947 to Gheewala. This approach adds a row and column grid which connects to transistor pass-gates to selectively observe or drive a net in the user's circuit. This circuit is intended primarily to provide complete observability when used in conjunction with automatic test vector generation software. It has a limited ability to drive signals in the circuit, again due to limitations inherent in row and column addressing. As with the previous example, this test architecture cannot arbitrarily apply any pattern to the inputs of all logic cells.

Yet another example of prior art test circuits is U.S. Pat. No. 4,752,729 to Jackson. Although this circuit appears to be intended mostly for applying patterns useful for life-testing a device, its technique has some application in general circuit test. Here, interface circuits are inserted at various points within an integrated circuit. Each interface circuit controls the value of the logic signal which passes through the particular net under control of test signals which come from the exterior of the device and are connected in common to all interface circuits. Interface circuits can allow a signal simply to pass through or alternately to be forced to a logic "1" or "0" value. It is important to note that since all interface circuits follow the same test signals, it is impossible to use this scheme for applying any arbitrary pattern to any logic circuit within the integrated circuit.

Each of the imbedded test circuits in the last three examples has some ability to test an integrated circuit device regardless of whether the designer chose synchronous or asynchronous design techniques. However, none of these can fully control all the inputs of an internal circuit simultaneously and thus test that circuit by applying any arbitrary pattern to its inputs. It is this controllability that has been lacking and thus prevented an integrated circuit to be fully tested for all possible design implementations, using an imbedded test circuit.

SUMMARY OF THE INVENTION

The object of the present invention is to provide, in an integrated circuit device containing multiple logic cells, imbedded test circuitry which does not require a particular design technique on the part of the user, or a particular logic cell structure (in other words, the designer may use synchronous or asynchronous design techniques). This imbedded test circuitry can also verify the integrity of the entire device without any knowledge of the operation of the implemented circuit as a whole. To accomplish this, a new architecture is disclosed which provides the ability to arbitrarily force any combination of logic values to be simultaneously driven onto any combination of internal nets. This allows all of the connections to each logic cell, and the logic cell itself, to be verified by applying a set of arbitrary test patterns to all of the inputs of each logic cell individually.

To apply any arbitrary test pattern to the inputs of a logic cell, the present invention provides test storage elements which are distributed throughout the integrated circuit device and control test circuits which determine the logic state on selected logic cell outputs within the integrated circuit device. These test circuits which allow any logic value to be forced on a logic cell output are inserted into each logic cell just before the logic cell output. As the addition of these circuits in series with the logic cells adds some delay to any logic signal passing through a logic cell, it is a further object of this invention to combine the test storage elements and added test circuits so as to minimize any added delay or additional numbers of transistors due to the presence of the imbedded test circuitry.

BRIEF DESCRIPTION OF THE DRAWINGS

FIG. 2 shows an expanded view of one logic cell of the present invention showing the Logic Function Generator along with the Output Driver and Test Latch.

FIG. 3 shows an expanded view of an alternative embodiment of one logic cell having greater flexibility.

FIG. 2A shows how the value encoded in the Test Strobe bits of the circuit implementation of FIG. 2 affect the operation of that circuit.

FIG. 3A shows how the value encoded in the Test Data bits of the circuit implementation of FIG. 3 affect the operation of that circuit.

DETAILED DESCRIPTION

Figure 1:
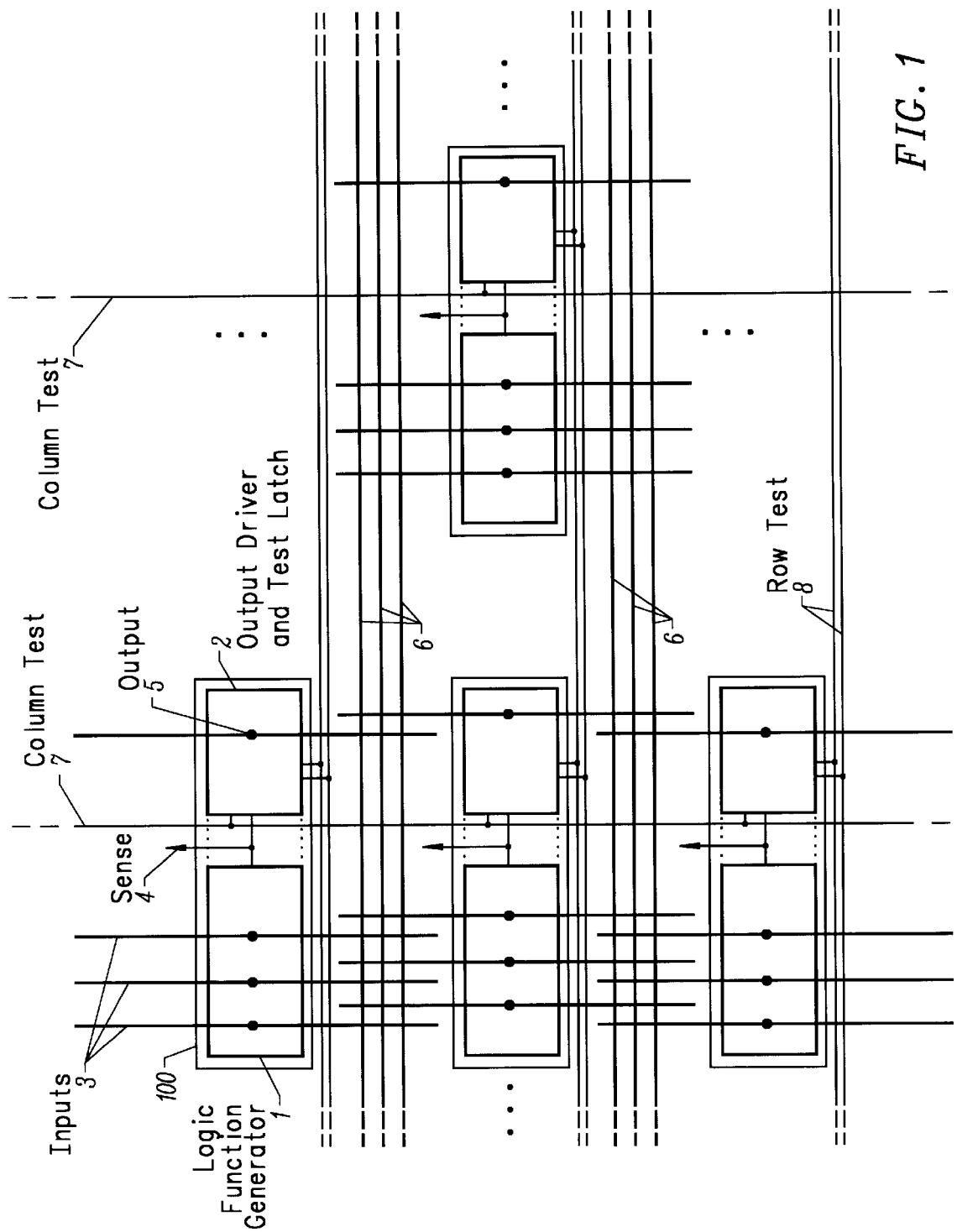
FIG. 1 shows a portion of the logic cell based array of an integrated circuit utilizing the present invention.

The present invention requires a logic cell based array approach as shown in FIG. 1. In accordance with the invention, each logic cell 100 is made up of two parts, the Logic Function Generator 1 and the Output Driver and Test Latch 2, which is inserted between the outputs of any driven circuitry (i.e., the logic function generator) and the logic cell output which would otherwise be connected to the logic function generator. There may be any number of inputs 3 to Logic Function Generator 1. The output of the Logic Function Generator 1 is connected to both the input of the Output Driver and Test Latch 2 and a sensing circuit (not shown). Many structures of sensing circuitry are known in the art and are therefore not mentioned here. The sensing circuit must be able to pass a logic value from the sense signal 4 to an external pin of the integrated circuit device. The output 5 of the Output Driver and Test Latch 2 may be connected to any number of inputs of other logic cells by way of routing tracks 6.

Output Driver and Test Latch 2 has a plurality of additional test inputs which are dedicated to the purpose of testing the device. These test inputs include the Row Test bits 8 and the Column Test bits 7. These groups of test bits are driven along the rows and columns formed by the logic cells 100. Which group is chosen to drive the rows, and which the columns, is arbitrary. In the configuration shown, each Column Test bit 7 is applied to all the logic cells 100 in a column, and the Row Test bits 8 (each one common to all logic cells 100 in a row) are applied to the rows.

As shown in FIG. 2A, in the example embodiment of FIG. 2 there are two Row Test bits 8, here named Test Strobes STR0 and STR1, which define three modes of operation: Normal, Latch Open (where a new test condition is entered by allowing a new Test Data value to be incorporated), and Latch Closed (where the test condition is frozen).

One embodiment for Output Driver and Test Latch 2 is shown in FIG. 2. Here, in FIG. 2, the test storage element is implemented with a latch made from a 3-to-1 Mux 10. This Test Latch then feeds the logic cell's Output Driver 11. It is important to note that, by combining in the same Mux 10, the test circuit which selects normal or test data as well as the Test Latch, fewer transistors will be necessary to implement the imbedded test function while any extra delay for logic signals passing through the Test Latch during normal operation is minimized.

Of course, other types of circuitry may be used for the test storage element which is here, in FIG. 2, implemented by a Test Latch. In addition to edge-triggered devices such as flip-flops, it is also acceptable to use dynamic storage elements where stored information may be lost after some time period has passed. Dynamic storage elements are acceptable when the number of nets which must be driven to test one particular logic cell is relatively small. Here, the test cycle time is relatively small compared with the retention time of the dynamic storage elements.

One alternative embodiment is shown in FIG. 3. Here, a test command is applied to all of the logic cells 100 in a row via row Test bits 8 (here named Test Data bits CMD0 and CMD1 in FIG. 3A) and subsequently, Column Test 7, or Test Strobes, are applied to those logic cells 100 where it is desired that the test command take effect. This allows some logic cells in a row to be placed in a test condition (e.g., drive a high or low test value (see FIG. 3A), while other logic cells in the same row are left in a normal condition where the output of Logic Function Generator 1 is passed to the Output Driver 11. To accomplish this, 2-to-1 Mux 14 stores whether the logic cell 100 will be placed in a normal or test condition. The output of Mux 14 controls another Mux 15 which selects either the output of the Logic Function Generator 1 or the output of Mux 17, which stores a test value (a high or low value).

The embodiment shown in FIG. 3 provides a more flexible implementation than that of FIG. 2 in that a first logic cell can pass through the logic value generated by its Logic Function Generator to some driven logic cell. Meanwhile, other logic cells provide test values to control both the first logic cell and any driven logic cells. This logic value from the first logic cell can then be passed through to the output of the Logic Function Generator 1 of the driven logic cell where it is observed by a sensing circuit. In this way, the path from logic cell inputs 3 to the outputs 5 of Output Driver and Test Latch 2 can be tested. This is important since, during the testing of a single logic cell, the output logic value is available at the Sense signal 4 before it is applied to output selection Mux 15.

Even though imbedded test circuitry for a logic cell based array is not specifically shown with tri-state output circuits to implement the outputs of the Output Driver and Test Latch circuits, such a configuration is easily tested by the embodiment of FIG. 3, as a logic cell output which controls a particular tri-state output can also be forced to any desired logic value in the same manner. To verify that an output with tri-state capability of a logic cell under test has entered a high impedance condition, it is necessary to provide a pull-up resistor through which the output 5 of the Output Driver and Test Latch can connect to a known logic value so that the output 5 will be pulled to that known value when placed in a high impedance condition.

While particular embodiments of the present invention have been shown and described, it will be obvious to those skilled in the art that changes and modifications may be made without departing from this invention in its broader aspects and, therefore, the appended claims are to encompass within their scope all such changes and modification as fall within the true spirit and scope of this invention.

What is claimed is:

1. An integrated circuit, comprising:
 a prefabricated array of logic cells, couplable to form an arbitrary circuit, wherein a plurality of logic cells in said array each includes:
  a cell output;
  a logic function generator;
  a test circuit, operably coupled to said cell output and to said logic function generator, said test circuit operable in a first mode of operation to pass a test logic value to said cell output and operable in a second mode of operation to pass a generated logic value from said logic function generator to said cell output, said test circuit included in each of said plurality of logic cells in said prefabricated array of logic cells prior to coupling said prefabricated array of logic cells to form said arbitrary circuit and regardless of the arbitrary circuit to be ultimately formed by coupling said prefabricated array of logic cells.

2. The integrated circuit of claim 1, wherein the test circuit in some logic cells in said array of logic cells is operable in said first mode of operation while simultaneously the test circuit in other logic cells in said array of logic cells is operable in said second mode of operation.

3. The integrated circuit of claim 1, wherein each logic cell in said array further includes a sense output, coupled to said logic function generator, to carry said generated logic value.

4. The integrated circuit of claim 3, wherein said sense output carries said generated logic value when said test circuit is operating in said first mode of operation and when the test circuit is operating in said second mode of operation.

5. The integrated circuit of claim 1, wherein said first mode of operation includes holding said test logic value on said cell output.

6. The integrated circuit of claim 1, wherein each of said plurality of logic cells in said array further includes:
 a first test input coupled to said test circuit; and
 a second test input coupled to said test circuit.

7. The integrated circuit of claim 6, wherein the mode of operation of said test circuit is determined by at least one of a signal carried on said first test input and a signal carried on said second test input.

8. The integrated circuit of claim 7, wherein said first test input is a row test input and said second test input is a column test input.

9. The integrated circuit of claim 1, wherein, when said logic cells are coupled to form said arbitrary circuit, the logic function generator in some of said logic cells in said array of logic cells implements a synchronous function while the logic function generator in other of said logic cells in said array of logic cells implements an asynchronous function.

10. The integrated circuit of claim 1, wherein said test circuit includes a multiplexor.

11. The integrated circuit of claim 10, wherein said test circuit includes a plurality of multiplexors.

12. The integrated circuit of claim 11, wherein at least two of said plurality of multiplexors are each configured to be operable as a latch.

13. The integrated circuit of claim 10, wherein said test circuit includes only said multiplexor.

14. The integrated circuit of claim 13, wherein said multiplexor is configured to be operable as a latch.

15. The integrated circuit of claim 1, wherein said test circuit includes a storage unit.

16. The integrated circuit of claim 15, wherein said storage unit includes a latch.

17. The integrated circuit of claim 16, wherein said test circuit includes only said latch.

18. The integrated circuit of claim 15, wherein said storage unit includes a dynamic storage element.

19. The integrated circuit of claim 1, wherein said cell output in each of said plurality of logic cells is coupled to a driver.

20. The integrated circuit of claim 1, wherein:
 said cell output is a tri-state output; and
 said logic cell further includes a pull-up resistor coupled to said cell output.

21. An integrated circuit, comprising:
 a prefabricated array of logic cells, couplable to form any one of a plurality of circuits, wherein a plurality of logic cells in said array each includes:
  a first test input;
  a second test input;
  a cell output circuit having a cell output;
  a logic function generator having a generator output for carrying a generated logic value;
  a test circuit, coupled to said cell output circuit, coupled to said generator output, and coupled to said first test input and said second test input, said test circuit operable in a first mode of operation to pass a test logic value to said cell output and operable in a second mode of operation to pass said generated logic value to said cell output, wherein the mode of operation of said test circuit is determined by at least one of a signal carried on said first test input and a signal carried on said second test input, said test circuit included in each of said plurality of logic cells regardless of the function to be performed by said logic function generator when said prefabricated array of logic cells is coupled to form one of said plurality of circuits; and
 wherein the test circuits in some logic cells in said array of logic cells are operable in said first mode of operation while simultaneously the test circuits in other logic cells in said array of logic cells are operable in said second mode of operation.

22. The integrated circuit of claim 21, wherein each logic cell in said plurality of logic cells includes a sense output, coupled to said generator output, to carry said generated logic value.

23. The integrated circuit of claim 21, wherein said first mode of operation includes holding said test logic value on said cell output.

24. The integrated circuit of claim 21, wherein each logic cell in said plurality of logic cells further includes a third test input coupled to said test circuit, wherein said first test input is for carrying said test logic value, and said second test input and said third test input are for carrying signals to select said mode of operation of said test circuit.

25. The integrated circuit of claim 21, wherein, when said prefabricated array of logic cells is coupled to form one of said plurality of circuits, the logic function generator in some of said logic cells in said array of logic cells implements a synchronous function while the logic function generator in other of said logic cells in said array of logic cells implements an asynchronous function.

26. The integrated circuit of claim 21, wherein said first input is a column test input and said second input is a row test input.

27. The integrated circuit of claim 21, wherein said test circuit includes a storage unit.

28. The integrated circuit of claim 27, wherein said storage unit includes a multiplexor.

29. The integrated circuit of claim 28, wherein said multiplexor is configured to be operable as a latch.

30. An integrated circuit, comprising:

a prefabricated array of logic cells, couplable to form any one of a plurality of circuits, wherein, regardless of which one of said plurality of circuits said array of logic cells is ultimately coupled to form, each logic cell in said array includes:
a row test input;
a column test input;
a cell output circuit having a cell output;
a logic function generator having a generator output for carrying a generated logic value;
a test circuit, including a one-bit test storage unit having an input and an output, said one-bit test storage unit input coupled to said generator output, said one-bit test storage unit output coupled to said cell output circuit, and said one-bit test storage unit coupled to said row test input and to said column test input, said one-bit test storage unit operable in a first mode of operation to pass said test logic value to said cell output and hold said test logic value on said cell output, and said one-bit test storage unit operable in a second mode of operation to pass said generated logic value to said cell output, wherein the mode of operation of said one-bit test storage unit is determined by at least one of a signal carried on said row test input and a signal carried on said column test input;
wherein the one-bit test storage unit in some logic cells in said array of logic cells are operable in said first mode of operation while simultaneously the one-bit test storage unit in other logic cells in said array of logic cells are operable in said second mode of operation.

31. The integrated circuit of claim 30, wherein each logic cell in said array further includes a sense output coupled to said generator output, to carry said generated logic value.

32. The integrated circuit of claim 30, wherein each logic cell further includes a second row test input coupled to said test circuit for carrying a second row test signal, and wherein said mode of operation is determined by said row test signal and said second row test signal.

33. The integrated circuit of claim 32, wherein said test circuit includes one and only one one-bit storage unit.

34. The integrated circuit of claim 33, wherein said one-bit test storage unit includes a multiplexor configured to be operable as a latch, wherein:
a first input of said multiplexor is coupled to said generator output;
a second input of said multiplexor is coupled to receive said test logic value;
a third input of said multiplexor is coupled to the output of said multiplexor;
a first select input of said multiplexor is coupled to said row test input; and
a second select input of said multiplexor is coupled to said second row test input.

35. A method of forming an integrated circuit, comprising the sequential steps of:

forming a prefabricated array of logic cells, wherein each logic cell has a cell output, a logic function generator and a test circuit operably coupled to said logic function generator and said cell output and operable in a first mode of operation to pass a test logic value to said cell output and operable in a second mode of operation to pass a generated logic value from said logic function generator to said cell output; and forming any one of a plurality of circuits by coupling some of said logic cells in said array of logic cells to other logic cells in said array of logic cells.

36. The method of claim 35, wherein said step of forming an array of logic cells includes forming the test circuit in each logic cell such that the test circuits in some of said array of logic cells are operable in said first mode of operation while simultaneously the test circuits in other logic cells in said array of logic cells are operable in said second mode of operation.

37. The method of claim 35, wherein said step of forming an array of logic cells includes forming in each logic cell a sense output, coupled to said generator output, to carry said generated logic value.

38. The method of claim 35, wherein said step of forming an array of logic cells includes forming said array of logic cells wherein each logic cell further includes a first test input and a second test input, both said first test input and said second test input coupled to said test circuit.

39. The method of claim 38, wherein said step of forming an array of logic cells includes forming said array of logic cells wherein each logic cell further includes a third test input coupled to said test circuit, wherein said first test input is for carrying said test logic value, and said second test input and said third test input are for carrying signals to select said mode of operation of said test circuit.

40. The method of claim 39, wherein said first input is a column test input and said second input and said third input are formed as row test inputs.

41. The method of claim 35, wherein, after said step of forming any one of a plurality of circuits, the logic function generator in some of said logic cells in said array of logic cells implements a synchronous function while the logic function generator in other of said logic cells in said array of logic cells implements an asynchronous function.

42. The method of claim 35, wherein said step of forming said array of logic cells includes forming said test circuit to include a storage unit.

43. The method of claim 42, wherein said storage unit includes a multiplexor.

44. The method of claim 43, wherein said multiplexor is configured to be operable as a latch.

45. A method of testing an integrated circuit having a prefabricated array of logic cells, said array of logic cells coupled to form any one of a plurality of circuits, wherein each logic cell in said array includes a first input, a second input, a cell output, a logic function generator, and a test circuit operably coupled to said logic function generator said cell output, said first input, and said second input, comprising the steps of:

applying a first mode selection signal to said first input of a first logic cell in said array of logic cells to select a test mode of operation for said test circuit in said first logic cell;

applying a test value to said second input of said first logic cell;

passing, by said test circuit of said first logic cell, said test value to said cell output of said first logic cell;

holding, by said test circuit of said first logic cell, said test value on said cell output of said first logic cell;

applying, while said first logic cell is in said test mode of operation, a second mode selection signal to said first input of a second logic cell to select a pass-through mode of operation for said test circuit of said second logic cell to pass a generated logic value from said logic function generator of said second logic cell to said cell output of said second logic cell.

46. The method of claim 45, wherein said step of applying a test value to said second input of said first logic cell precedes said step of applying a first selection signal to said first input of said first logic cell.

47. The method of claim 45, further including the step of applying a third selection signal to said first input of said first logic cell to select a pass-through mode of operation for said test circuit of said first logic cell to pass said generated logic value of said first logic cell to said cell output of said first logic cell.

* * * * *